(12) United States Patent
Komander et al.

(10) Patent No.: US 11,728,154 B2
(45) Date of Patent: Aug. 15, 2023

(54) SPECTROMETER AMPLIFIER COMPENSATION

(71) Applicant: Thermo Fisher Scientific (Bremen) GmbH, Bremen (DE)

(72) Inventors: Peter Komander, Bremen (DE); Heinz Lerche, Bremen (DE)

(*) Notice: Subject to any disclaimer, the term of this patent is extended or adjusted under 35 U.S.C. 154(b) by 64 days.

(21) Appl. No.: 17/535,452

(22) Filed: Nov. 24, 2021

(65) Prior Publication Data

US 2022/0181133 A1    Jun. 9, 2022

(30) Foreign Application Priority Data

Dec. 4, 2020 (GB) .................................. 2019172
Dec. 21, 2020 (GB) .................................. 2020311
Nov. 22, 2021 (GB) .................................. 2116767

(51) Int. Cl.
   *H01J 49/02* (2006.01)
   *H01J 49/26* (2006.01)
   *H03F 3/04* (2006.01)
   *G01T 1/24* (2006.01)

(52) U.S. Cl.
   CPC ............ *H01J 49/022* (2013.01); *G01T 1/247* (2013.01); *H01J 49/025* (2013.01); *H01J 49/26* (2013.01); *H03F 3/04* (2013.01)

(58) Field of Classification Search
   CPC ........ H01J 49/022; H01J 49/26; H01J 49/025; G01T 1/247; H03F 3/04; H03F 3/45475; H03F 1/32; H03F 1/12; H03F 1/14; H03F 2200/462; H03F 2203/45528; G01R 19/0061; G01N 27/62

USPC .................................................. 250/281, 397
See application file for complete search history.

(56) References Cited

U.S. PATENT DOCUMENTS 9,431,976 B2    8/2016 Lerche
2014/0111215 A1*  4/2014 Inukai ..................... H03K 5/24
                                                        327/83
2015/0325420 A1* 11/2015 Collings ............ H01J 49/0031
                                                        250/281

FOREIGN PATENT DOCUMENTS

GB    2424330 A    3/2006
GB    2526857 A    12/2015

OTHER PUBLICATIONS

Combined Search and Examination Report dated Jun. 11, 2021, to GB Patent Application No. 2020311.3.

* cited by examiner

*Primary Examiner* — Kiet T Nguyen (57) ABSTRACT

An ion detection current conversion circuit includes a conversion amplifier coupled with a conversion resistor assembly for converting an ion detection current produced by an ion detector into an ion detection voltage, the conversion resistor assembly comprising a resistor having a high resistance and a capacitive compensation element, and a compensation voltage circuit for deriving a compensation voltage from the ion detection voltage and feeding the compensation voltage to the capacitive compensation element, the compensation voltage circuit comprising a variable resistor for adjusting the compensation voltage.

23 Claims, 8 Drawing Sheets

SPECTROMETER AMPLIFIER COMPENSATION

This application claims the benefit of GB patent application no. 2116767.1, filed Nov. 22, 2021. GB patent application no. 2116767.1 claims the benefit of GB patent application no. 2020311.3, filed Dec. 21, 2020. GB patent application no. 2020311.3 claims the benefit of GB patent application no. 2019172.2, filed Dec. 4, 2020. The content of the aforementioned applications are incorporated by reference in their entirety.

FIELD OF THE INVENTION

The present disclosure relates to conversion circuits for ion detectors in mass spectrometers and other instruments. More in particular, the present invention relates to amplifiers for amplifying very small ion detection currents, which amplifiers comprise a current-to-voltage conversion resistor having a very high resistance and a compensation circuit for compensating any non-ideal characteristics of the current-to-voltage conversion resistor.

BACKGROUND OF THE INVENTION

Mass spectrometers having ions detectors are well known. Such mass spectrometers may comprise mass filters for selecting ions having a certain mass-charge (m/z) range, and/or mass filters for spatially separating ions having different mass-charge ratios. Ion detector which are often used are Faraday cups, secondary electron detectors (SEDs) and other detectors.

When detecting small amounts of ions, the detection current produced by a detector may be very small, for example less than 1 nA (nano-Ampère), often less than 1 pA (pico-Ampère), sometimes in the range of a few fA (femto-Ampère). To convert such small currents into a voltage that can be meaningfully evaluated, a resistor having a high resistance value is required. Typically, a resistor having a resistance of tens or hundreds of GW (gigaohm), sometimes even of a few TW (teraohm) or even 10 TW is used. Such a resistor is often used as a feedback resistor of an amplifier, which may be referred to as transimpedance amplifier.

Resistors having a resistance of hundreds of GW or even a resistance in the TW range have the disadvantage that their behavior is not entirely linear, which of course may decrease the accuracy of the ion measurements. In particular, such resistors may suffer from parasitic capacitances and/or dielectric relaxation, also known as dielectric absorption or soakage.

U.S. Pat. No. 9,431,976 (Lerche), which is herewith incorporated by reference in this disclosure, discloses a transimpedance amplifier including a resistor assembly coupled between an output of the transimpedance amplifier and an input of the transimpedance amplifier, and a voltage source for applying a first voltage to a first capacitive compensation element of the resistor assembly and a second voltage to a second capacitive compensation element of the resistor assembly. The first voltage and the second voltage are each derived from the output voltage of the transimpedance amplifier. The voltage source includes a voltage controller for adjusting at least one of the first proportion and/or the second proportion.

The capacitive compensation elements of the resistor assembly disclosed in U.S. Pat. No. 9,431,976 may be conductive rings arranged around but electrically isolated from the high-resistance resistor. The rings constitute capacitances, to which compensation voltages are applied. Thus, the parasitic capacitances of the high-resistance resistor can be compensated. The compensation voltages are derived from the output signal of the amplifier and are each a fraction of that output signal. To provide a proper compensation, the fractions need to be carefully adjusted by means of resistor networks including variable resistors, which are also called potentiometers. Such variable resistors are, however, typically manually operated, and it requires a substantial amount of time to manually tune the resistor values.

U.S. Pat. No. 9,431,976 mentions the option of providing a digital circuit to set the voltages that are applied to the capacitive compensation elements, but details of the digital circuit are not described. It has been found that the use of digital potentiometers as variable resistors is beneficial as it allows the resistor values to be adjusted remotely. However, the maximum voltage that can be applied to digital potentiometers is limited. In some applications, the ion detection amplifier may have an output voltage of 50 V or even 100 V, which exceeds the allowable voltage of commercially available digital potentiometers, meaning that digital potentiometers cannot readily replace manually operated potentiometers.

SUMMARY OF THE INVENTION

The present disclosure provides a solution to this problem. Accordingly, the present invention provides a conversion circuit for converting an ion detection current produced by an ion detector into an ion detection voltage, the conversion circuit comprising:
  a conversion amplifier coupled with a conversion resistor assembly for converting an ion detection current into an ion detection voltage, the conversion resistor assembly comprising at least one resistor having a high resistance and at least one capacitive compensation element,
  a compensation voltage circuit for deriving at least one compensation voltage from the ion detection voltage and feeding the at least one compensation voltage to the at least one capacitive compensation element, the compensation voltage circuit comprising at least one variable resistor for adjusting the at least one compensation voltage,
  a voltage reduction circuit for deriving a reduced voltage from the ion detection voltage, the voltage reduction circuit being arranged for supplying the reduced voltage to the at least one variable resistor,
  the compensation voltage circuit comprising at least one neutralizing amplifier unit coupled between the at least one capacitive compensation element and the at least one variable resistor for at least partially neutralizing the voltage reduction of the voltage reduction circuit.

By providing a voltage reduction circuit for deriving a reduced (ion detection) voltage from the ion detection voltage, a lower voltage can be fed to the variable resistors. Conversely, using commercially available variable resistors and/or other components requiring a relatively low voltage, a higher ion detection voltage can be used. For example, a maximum ion detection voltage of up to 50 V or even of up to 100 V may be used, while utilizing components having a maximum allowable voltage of only 20 V, by reducing the ion detection voltage by a factor of 0.4 or even 0.2.

By providing at least one neutralizing amplifier for neutralizing this reduction of the voltage, the effectiveness of the capacitive compensation element(s) is not hampered. The at least one neutralizing amplifier for neutralizing the reduction of the ion detection voltage may amplify the output voltage of the digital variable resistor with a factor which is the inverse of the factor by which the ion detection voltage was lowered. For example, if the voltage reduction circuit applies a (first) factor of 0.2 to lower the voltage from 100 V to 20 V, then the compensating amplifier may apply a (second) factor of 5 to compensate. The lowering or reduction of the ion detection voltage may be achieved using a voltage divider. The voltage is preferably reduced no more than necessary to stay within the operating range of the variable resistors and/or other low-voltage components so as to avoid any unnecessary amplification.

By using at least one variable resistor, adjustment of the compensation voltage circuit is made possible. By using for example remotely controllable resistors, such as digital variable resistors, remote adjustment of the compensation voltage circuit is made possible. It is noted that a variable resistor may comprise a potentiometer, that is, a resistor with three terminals.

The voltage reduction circuit may comprise a voltage divider and an amplifier, such as an operational amplifier. The output terminal of the voltage divider may be connected to an inverting input of the operational amplifier. In such embodiments, the reduction factor of the voltage reduction circuit can be negative.

The voltage reduction circuit may be arranged for effecting a voltage reduction of at least 25%, preferably at least 50%, more preferably at least 75%. In some embodiments, the voltage reduction may be 90%, corresponding with a reduction factor of 0.1 (or −0.1, if an inverting amplifier is used).

A neutralizing amplifier unit may comprise at least one neutralizing amplifier and at least one voltage divider, the voltage divider preferably being connect to the variable resistor. The output terminal of the voltage divider, that is, the terminal providing the divided voltage, may be connected to an input of the neutralizing amplifier, such as the inverting input. Conversely, the at least one neutralizing amplifier unit may be arranged in series with a variable voltage terminal of the at least one variable resistor.

The conversion circuit may comprise at least two neutralizing amplifier units and at least two variable resistors. In some embodiments, the conversion circuit may comprise three, four, five or six neutralizing amplifier units, each being coupled to an associated variable resistor.

The conversion circuit may further comprise at least one RC circuit coupled between an output terminal of the conversion resistor and a series arrangement of a further neutralizing amplifier unit and a further variable resistor. Such an RC circuit serves to compensate any parasitic capacitances and dielectric relaxation effects of the conversion circuit, in addition to the compensation provided by the capacitive compensation element which primarily serves to compensate non-linear characteristics of the conversion resistor. Although the at least one RC circuit is not essential, it improves the properties of the conversion circuit. While the capacitive compensation element arranged near and/or around the conversion resistor primarily serves to compensate substantially constant deviations from the desired output voltage, the one or more RC circuits primarily serve to compensate time-varying deviations from the desired output voltage.

The conversion circuit may further comprise an additional resistor coupled between the conversion resistor and an output of the conversion amplifier, the additional resistor having a resistance which is small relative to the resistance of the conversion resistor. The additional resistor thus connects the output terminal of the conversion resistor to the output terminal of the conversion amplifier. The resistance of the additional resistor may less than 1% of the resistance of the conversion resistor, preferably less than 0.1%, more preferably less than 0.01%. In practice, the resistance of the additional resistor may be less than 0.001% of the resistance of the conversion resistor, for example between 10 kW and 100 kW while the resistance of the conversion resistor is 1 TW, or less than $(100 \times 10^3 / 1 \times 10^{12}) \times 100\% = 1.0 \times 10^{-5}\%$.

The effect of each RC circuit on the output voltage ($V_{out}$) of the conversion circuit depends on the ratio of the resistance of the additional resistor to the resistance of the resistor of the particular RC circuit.

The conversion circuit may comprise at least two parallel RC circuits having different time constants. That is, the individual RC circuits may comprise components having different resistances and/or capacitances. In some embodiments, the conversion circuit may comprise three, four, five or more parallel RC circuits having different time constants. The time constants of the RC circuits may be distributed approximately logarithmically.

The at least one variable resistor preferably is a digital variable resistor. That is, the one or more variable resistors may be digitally controllable resistors. Such resistors may be capable of varying their resistance in a large number of steps, for example 512 steps, 1024 steps or 2048 steps, to allow a very fine tuning of the conversion circuit.

The disclosure also provides a conversion circuit for converting an ion detection current produced by an ion detector into an ion detection voltage, the conversion circuit comprising:

a conversion amplifier coupled with a conversion resistor assembly for converting an ion detection current into an ion detection voltage, the conversion resistor assembly comprising at least one resistor having a high resistance and at least one capacitive compensation element, a compensation voltage circuit for deriving at least one compensation voltage from the ion detection voltage and feeding the at least one compensation voltage to the at least one capacitive compensation element, the compensation voltage circuit comprising at least one variable resistor for adjusting the at least one compensation voltage, and at least one compensatory RC circuit coupled to the conversion resistor.

By providing at least one compensatory RC circuit coupled to the conversion resistor, further deviations from the desired output voltage may be compensated or at least mitigated. Such further deviations may in particular be time-varying deviations from the desired output voltage caused for example by dielectric relaxation effects of components of the conversion circuit.

The conversion circuit may further comprise an additional resistor coupled between the conversion resistor and an output of the conversion amplifier, the additional resistor having a resistance which is small relative to the resistance of the conversion resistor. The resistance of the additional resistor may be less than 1% of the resistance of the conversion resistor, preferably less than 0.1%, more preferably less than 0.01%.

The conversion circuit may comprise at least two parallel compensatory RC circuits. The at least two parallel compensatory RC circuits may have different time constants. A compensatory RC circuit may be coupled to a variable resistor.

The conversion resistor may have a resistance of at least 100 MW, for example a resistance of 300 MW, 500 MW, 1

GW, 10 GW, 30 GW or 50 GW. A conversion resistor having a resistance of at least 100 GW, at least 300 GW, at least 1 TW, or even at least 10 TW may also be used in some embodiments. Thus, in some embodiments, a resistance of 30 TW, 50 TW or 100 TW may be used.

The conversion resistor assembly may comprise a single capacitive compensation element. In other embodiments, the conversion resistor assembly may comprise a more than one capacitive compensation element, for example three capacitive compensation elements, although embodiments with two, four, five, six or more capacitive compensation elements may also be utilized. The conversion resistor assembly preferably comprises a single conversion resistor, although embodiments having two or more conversion resistors in series and/or in parallel may also be used.

The present disclosure also provides a mass spectrometer comprising a conversion circuit as described above. Such a mass spectrometer may comprise a magnetic sector unit and/or an electric sector unit and/or an array of Faraday cups and/or a mass filter. Other detectors, such as SEMs (secondary ion multipliers) may also be used. The mass spectrometer may also comprise an ion source.

It is noted that Japanese patent application JP 2013-148372 discloses a mercury atomic absorption spectrometer comprising gain adjusting digital potentiometers for adjusting the amplifier gain so that a standard voltage is adjusted to a predetermined set voltage. Said Japanese patent application fails to mention a compensation circuit for compensating non-ideal characteristics of a high resistance feedback resistor.

It is further noted that British patent application GB 2,424,330 discloses a transimpedance amplifier with a shielded feedback resistor. A screen circuit allows the capacitance effects of the feedback resistor to be more accurately defined and limited. The screen is therefore driven at one half of the output voltage. Although this known arrangement may be able to mitigate some of the capacitance effects of the feedback resistor, it is not tunable and can therefore not be adjusted to the characteristics of individual high value feedback resistors.

DETAILED DESCRIPTION OF THE DRAWINGS

Figure 1:
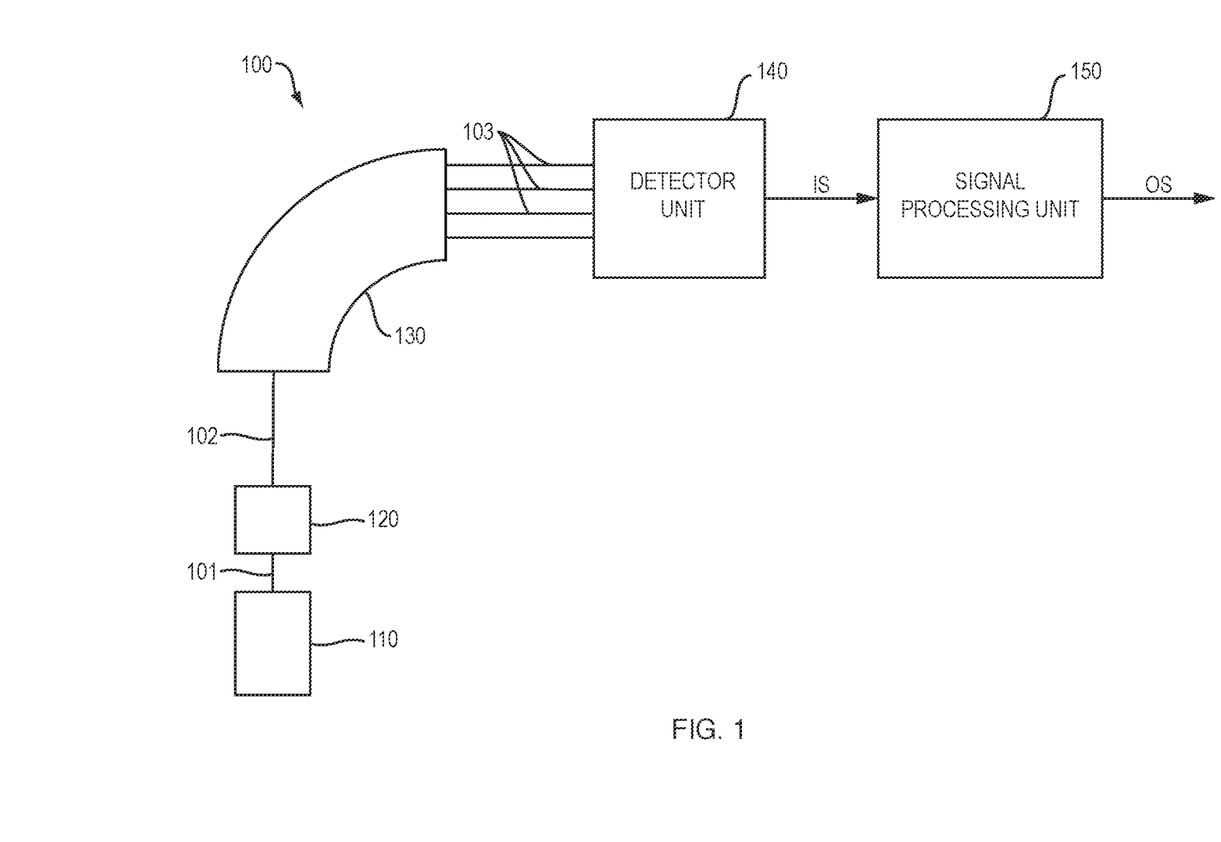
FIG. 1 schematically shows an exemplary embodiment of a mass spectrometer in which the present disclosure may be applied.

A mass spectrometer in which the invention may be applied is, by way of example, schematically illustrated in FIG. 1. The mass spectrometer 100 is shown to comprise an ion source 110, a beam focusing unit 120, a magnetic sector unit 130, a detector unit 140, and a detector signal processing unit 150. The ion source 110 may be a plasma source, such as an inductively coupled plasma (ICP) source, or a non-ICP source, such as a filament source. The ion source 110 is arranged for producing an original ion beam 101 which is focused by the beam focusing unit 120 to become a focused ion beam 102. The beam focusing unit 120 can comprise suitable ion optics which may be known per se. A mass filter (not shown) may optionally be arranged between the beam focusing unit 120 and the magnetic sector unit 130, as described in, for example, U.S. Pat. No. 10,867,780, which is herewith incorporated by reference in this document.

In the magnetic sector unit 130, ions contained in the ion beam 102 may be separated according to their respective masses. Thus, the single focused ion beam 102 entering the magnetic sector unit 130 is split up into multiple ions beams 103 which may reach different detectors of the detector unit 140, allowing ions having different masses to be detected separately. The detector unit 140 produces ion detection signals IS which can be amplified and further processed in the signal processing unit 150, resulting in output signals OS which may include an average detection frequency per ion detector, and hence per ion mass range.

In some embodiments, the magnetic sector unit may be replaced by or combined with an electric sector unit. Instead of, or in addition to a sector field unit, such as the magnetic sector unit 130, a mass filter unit such as a multipole unit (for example a quadrupole unitor or a hexapole unit) may be used.

Figure 2:
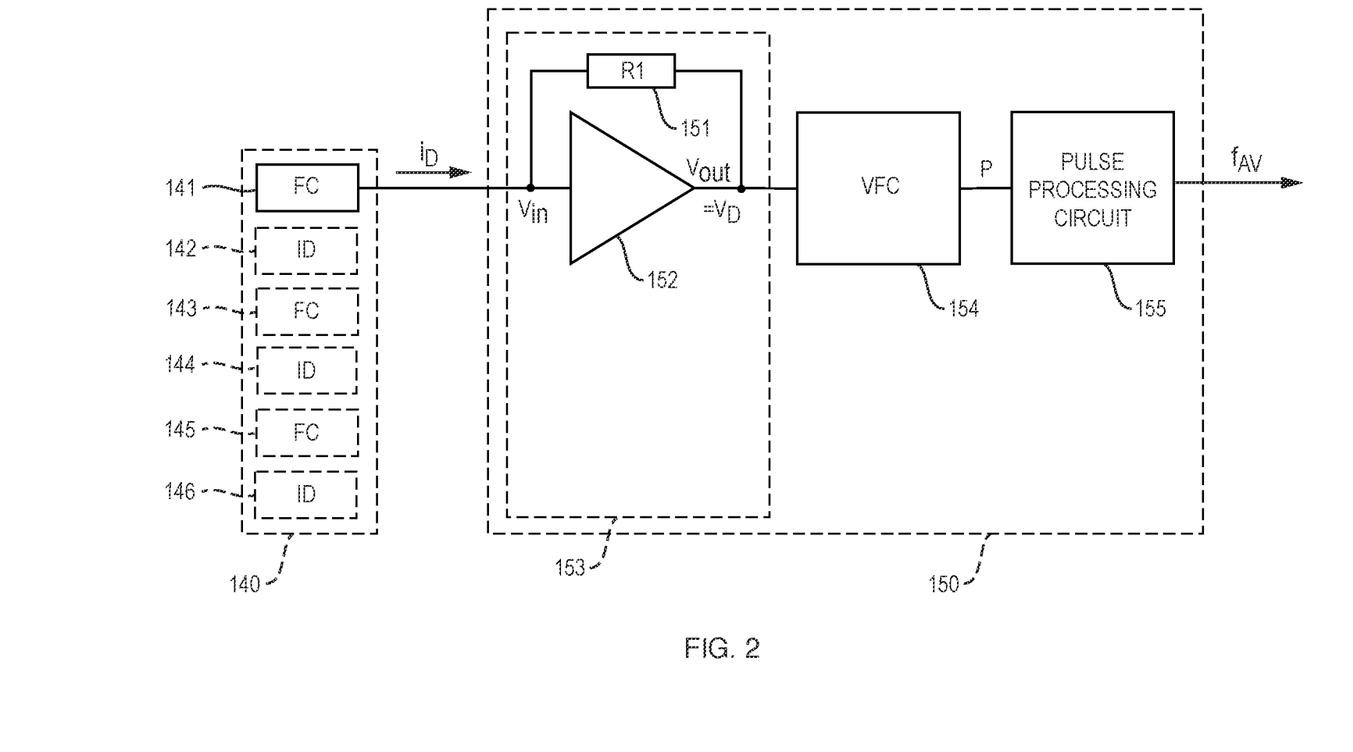
FIG. 2 schematically shows an embodiment of part of the mass spectrometer of FIG. 1 in more detail.

Part of the mass spectrometer 100 of FIG. 1 is shown in more detail in FIG. 2. In particular, FIG. 2 schematically shows part of the detector unit 140 and part of the signal processing unit 150.

The detector unit 140 is shown to comprise Faraday cups (FC) 141, 143 and 145, and additional ion detectors (ID) 142, 144 and 146. The detector unit 140 may comprise more (or less) Faraday cups and/or more (or less) additional ion detectors than shown here. In the example shown, the additional ion detectors are each arranged next to a Faraday cup, but this is not essential. The additional ion detectors may comprise compact discrete dynodes (CDDs) and/or secondary electron multipliers (SEMs).

As is well known, Faraday cups and similar ion detectors produce small currents proportional to the number of impinging ions. These small currents, typically in a range from 0.1 fA to 1 nA, are converted into a voltage which is then amplified to produce an ion detection voltage. To this end, the signal processing unit 150 comprises an input resistor 151 which has a very large resistance, typically in a range from 1 G□ to 1 T□. Such large resistance values are necessary to produce a suitable voltage for further processing: a current of 1 pA ($10^{-12}$ A) flowing through a resistor of 1 T□ ($10^{+12}$ □) produces a voltage across the resistor of just 1 V.

The detector current $i_D$ flowing from the Faraday cup 141 is, in the schematic diagram of FIG. 2, fed to the input or conversion resistor 151 and the input of the amplifier 152. It is noted that the amplifier 152 is drawn here only schematically, and that the amplifier 152 may for example comprise an operational amplifier having an inverting and a non-inverting input, the input resistor 151 being arranged in its negative feedback loop. If the non-inverting input is connected to ground, the resistor 151 is effectively connected to ground via the inverting input of the operational amplifier (virtual ground), the input current of the amplifier being negligible. The conversion resistor 151 and the amplifier 152 together constitute an amplifier circuit 153, more specifically a transimpedance amplifier circuit 153.

It is further noted that only a single input resistor 151 and a single amplifier 152 are shown here for the sake of simplicity of the drawing, but it will be understood that each Faraday cup and/or similar detector 141, 143 and 145 of the detector unit 140 may be connected to an individual input resistor 151 and an individual amplifier 152. In some embodiments, two or more Faraday cups may share an input resistor and an amplifier. The ion detectors 142, 144 and 146 may each be connected to a discriminator, which may in turn be connected to a counter (not shown in FIG. 2).

The amplifier 152 produces an output voltage $V_{out}$ which may be equal to, or larger than the input voltage $V_{in}$, for example 10 or 100 times larger. If the output voltage $V_{out}$ has substantially the same magnitude as the input voltage $V_{in}$, the amplifier 152 may be used as a buffer only. The output voltage $V_{out}$, which may also be referred to as detection voltage $V_D$ as it represents the quantity of detected ions, is fed to a voltage-to-frequency converter (VFC) 154, which produces pulses P with a frequency proportional to the voltage $V_{out}$. It has been found that VFCs have a high degree of linearity which makes accurate detections possible. It is noted that detector signals originating from some types of detectors, such as compact discrete dynodes (CDDs) and/or secondary electron multipliers (SEMs), are typically not fed to a VFC. It is further noted that the present invention is not limited to ion detection signals produced by ion detectors but may also be used in other fields, such as optical signals.

The pulses P produced by the VFC 154 may be fed to an optional pulse processing circuit 155 which may, for example, determine the average frequency of the pulses produced by the VFC 154 during certain time periods, which may be referred to as measurement intervals. For each time period, the pulse processing circuit 155 may produce an average frequency $f_A$. This average frequency can represent the number of ions that impinged upon the corresponding detector during that particular time period. To determine the average frequency, the pulse processing circuit may count the number of pulses during a time period, determine the duration of that time period, and divide the number of pulses by the duration. In some embodiments, the optional pulse processing circuit 155 may additionally or alternatively produce other data, such as the variance of the pulses and/or the duration of the pulse intervals. In some embodiments, the signal processing unit 150 may not output an average frequency or similar data but the actual pulses P produced by the VFC 154.

Figure 3:
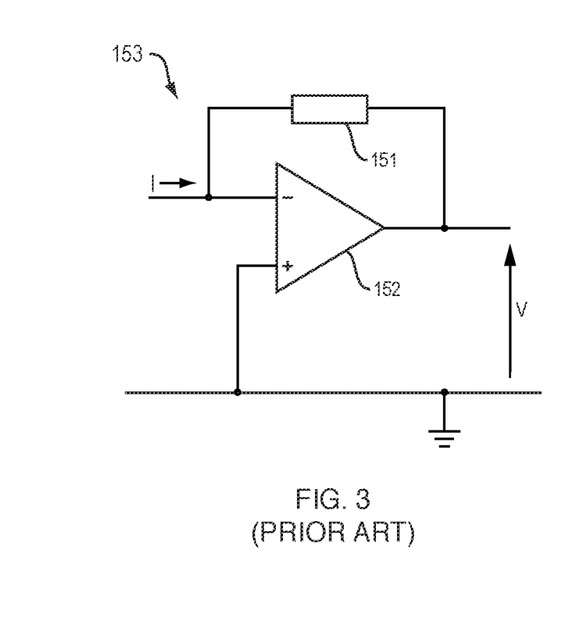
FIG. 3 schematically shows a first embodiment of a conversion amplifier unit of the prior art.

In FIG. 2, the amplifier 152 was shown as having a single input. As mentioned above, in actual implementations the amplifier 152 may comprise two inputs, such as an inverting and a non-inverting input. This is shown in FIG. 3, where the inverting input of the differential amplifier 152 provides a virtual ground while the conversion resistor 151 is part of a negative feedback loop.

As mentioned above, resistors having very or even ultra-high resistance values, such as 1 TW, typically suffer from non-linear behavior which may at least partially be due to parasitic capacitances and/or parasitic impedances. As disclosed in U.S. Pat. No. 9,431,976, compensation elements can be used to compensate for this non-linear behavior.

Figure 4:
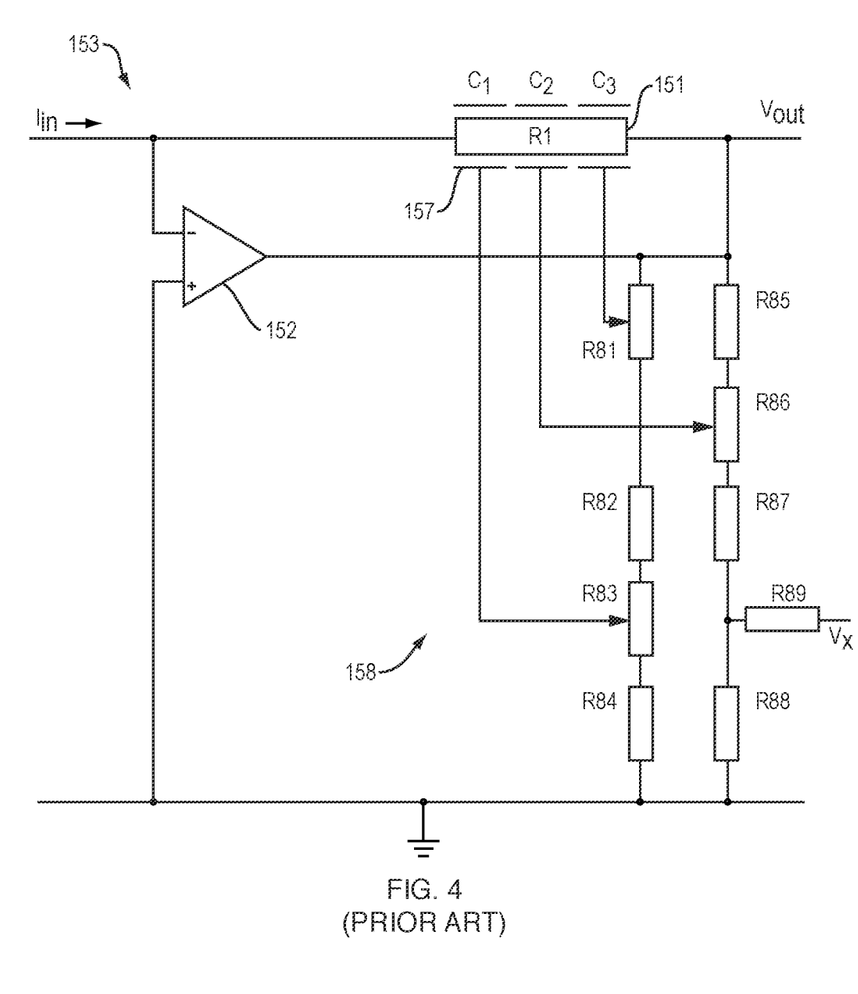
FIG. 4 schematically shows a second embodiment of a conversion amplifier unit of the prior art.

FIG. 4 shows a conversion circuit, which may also be referred to as transimpedance amplifier circuit, according to the prior art. The conversion circuit 153 of FIG. 4 comprises an operational amplifier 152 and a resistor assembly comprising an ultrahigh resistance value feedback (conversion) resistor 151 coupled between the output of the operational amplifier 152 and the inverting input of this operational amplifier 152. To compensate for the non-linearity of the feedback resistor 151, a compensation element 157 is comprised of conductive (for example, metal) compensation cylinders C1, C2 and C3 that surround the insulation of the feedback resistor 151. Each conductive cylinder has a length along the longitudinal length of the feedback resistor 151 and the length of each conductive cylinder C1, C2 and C3 may be the same or different. As shown in FIG. 4, each cylinder C1, C2 and C3 surrounds a different section of the feedback resistor 151, which may also be referred to as R1, along its length.

Each of the cylinders C1, C2 and C3 of the compensation element 157 may be formed with a gap between the cylinders C1, C2 and C3 and outer layer of the feedback resistor 151. Each cylinder C1, C2 and C3 is electrically isolated from the feedback resistor 151 and the other cylinders, such that a different voltage may be applied to each cylinder C1, C2 and C3. Each of the cylinders C1, C2 and C3 may act as (part of) a capacitor.

To apply suitable voltages to the compensation element 157, a compensation circuit 158 is provided which comprises a first voltage divider and a second voltage divider. The first voltage divider comprises resistors R81, R82, R83 and R84 while the second voltage divider comprises resistors R85, R86, R87 and R88. Resistors R81, R83 and R86 are variable resistors, that is, potentiometers which have two main terminals and a branch terminal, where the resistance between the branch terminal on the one hand and the main terminals on the other hand can be varied. A further resistor R89 is provided to receive an optional adjustment voltage Vx.

It has been found that in an arrangement as shown in FIG. 4, dielectric charging and discharging effects can occur. These effects are at least partially due to parasitic capacitances in the resistor 151 (R1), caused for example by the inherent capacitance of the windings of the resistor wire of which such high-ohmic resistances are typically made. It has been found that compensating such a parasitic capacitance by using the compensation circuit 158 is only possible to a limited extent. According to an aspect of the disclosure, a solution to this problem is provided by compensatory RC circuits, which will be explained in more detail with reference to FIGS. 5 & 6.

Although the known arrangement shown in FIG. 4 is capable of effectively compensating parasitic capacitances, it has the disadvantage that is has to be manually tuned. That is, the variable resistors R81, R83 and R86 have to be adjusted by a field engineer, for example, which is labor intensive. It would be preferable to be able to electronically adjust the variable resistors, thus allowing remote control. Digital variable resistors are available, but typically have low maximum voltages, such as 20 V. In many ion detection applications, ion detection voltages of 50 V or even 100 V may be used. This makes it impossible to use regular commercially available digital variable resistors (digital potentiometers). Another aspect of the present disclosure provides a solution to this problem by feeding only a fraction of the ion detection voltage to the digital variable resistors and then amplifying the output voltage of the digital variable resistors with approximately the inverse of this fraction to obtain the intended compensation voltage. This will further be explained later with reference to FIGS. 7 & 8.

Figure 5:
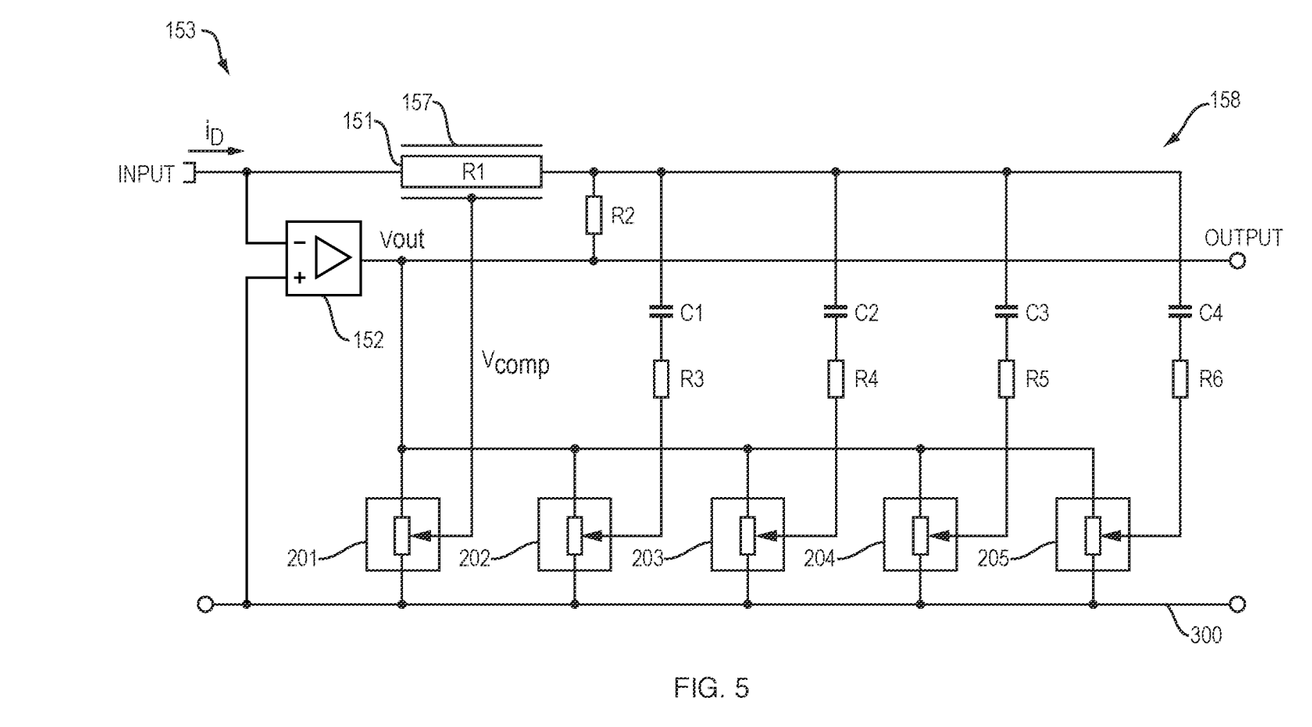
FIG. 5 schematically shows a first embodiment of a conversion amplifier unit of the disclosure.

FIG. 5 schematically shows a first embodiment of a conversion unit according to the present disclosure. An input terminal of the conversion unit 153 is shown to be connected to the inverting input of a conversion amplifier 152, while the non-inverting input is connected to ground, optionally via a compensating resistor network (not shown).

The output of the conversion amplifier 152 is connected with the output terminal of the conversion unit 153 and, via an additional resistor R2 and a conversion resistor 151 (which may also be referred to as R1), with the inverting input of the conversion amplifier 152. In the embodiment of FIG. 5, the conversion resistor 151 is provided with a compensation element 157 which may consist of a single part, for example a conductive tube at least partially enclosing but electrically isolated from the conversion resistor 151. The conversion resistor 151 may have a very high resistance of, for example, 10 GW, 100 GW, 1 TW, or higher. The additional resistor R2 may have a much lower resistance of, for example, between 10 kW and 100 kW. It will be understood that the contribution of the additional resistor R2 to the series resistance of the conversion resistor 151 and the additional resistor R2 will be very small. In some embodiments, in particular in embodiments where the conversion resistor has a value of less than approximately 500 GW, for example 100 GW, the compensation element 157 need not comprise a structure enclosing the conversion resistor but can be constituted by a regular capacitor.

The conversion unit 153 is shown to comprise a compensation circuit 158. Two types of compensation are provided by the compensation circuit 158:
- compensating any non-ideal properties of the conversion resistor 151 by supplying a fraction of the output voltage of the conversion circuit to the capacitive compensation element 157, thus directly influencing the conversion resistor 151, and
- compensating any dielectric relaxation effects of the components of the conversion unit 153, including the conversion resistor 151, by RC circuits having suitable time constants.

These two types of compensation are preferably used in combination but can be used independently of each other. It is noted that the components of conversion unit 153 typically have relatively large tolerances, not only the high resistance feedback resistor but also other components. In addition, many components including the PCB (printed circuit board) show dielectric relaxation effects, which may have a relatively strong influence on the output voltage considering the extremely small currents being converted into a voltage.

Accordingly, in the embodiment of FIG. 5 two parts of the compensation circuit 158 may be distinguished. A first part is connected to the compensation element 157 and comprises, in the embodiment shown, only the first variable resistor 201 which serves to apply a fraction of the output voltage to the compensation element 157. Thus, using the first variable resistor 201, a compensation voltage $V_{comp}$ between 0% and 100% of the output voltage $V_{out}$ can be supplied to the compensation element 157, a typical percentage being in a range from 30% to 70%, for example 50%. This is similar to the prior art arrangement shown in FIG. 4. However, in the embodiments of the present disclosure, the voltages applied to the variable resistors are much lower. As a result, the variable resistors may be digitally variable, thus allowing remote control of the variable resistors.

A second part of the compensation circuit 158 comprises parallel RC circuits coupled between the conversion resistor 151 and a common rail 300 via a respective variable resistor 202-205. The common rail 300 may be connected to ground.

The first RC circuit, for example, comprises a series arrangement of a first capacitor C1 and a resistor R3 connected to the variable resistor 202. It is noted that in the embodiment shown, the variable resistors 201-205 are all arranged between the output of the amplifier 152 and a common rail, which may in turn be connected to ground. The parallel RC circuits preferably have different time constants, which is achieved by different resistor and capacitor values. Thus, the values of C1 and R3 will typically differ from the values of C2 and R4, etc., thus providing different time constants. In some embodiments, the time constants of the RC circuits are distributed logarithmically. Although some time constants may have a duration of several seconds (for example 2 s), other time constants may have a duration of several minutes (for example 2.5 minutes or 150 s).

Accordingly, in the embodiment shown, four compensatory RC circuits are each directly connected to the output terminal of the conversion resistor 151 and each consists of a series arrangement of a capacitor (e.g. C2), a resistor (e.g. R4) and a variable resistor (e.g. 203). The maximum compensatory effect of each RC circuit may be determined by the ratio of R2 and the respective resistance of the RC circuit, so in the example shown the ratios R2/R3, R2/R4, R2/R4, and R2/R6 respectively. The maximum compensatory effect of the RC circuits may be expressed as $V_{maxcomp} = (R2/RX) \times DV$, where RX is the respective resistance of the RC circuit and DV is a voltage step at the output of the conversion resistor R1, that is, at the connection between R1 and R2. In practice, R2 has a much smaller resistance than R3, R4, R5 or R6.

The variable resistors may be digital potentiometers, which can be remotely controlled, thus making it possible to set the desired resistor values remotely. This also allows the desired values to be set automatically. In certain embodiments, digital potentiometers are chosen which consume very little power, such as less than 100 mW, preferably less than 10 mW, to keep the temperature of the circuit 153 constant. Each digital potentiometer preferably has a large number of resistance steps, for example 1024 steps, to allow an exact setting of the desired resistor values. Linear trimmers, which may be manually settable, may alternatively or additionally be used.

In the example shown, four parallel RC circuits are provided, but the disclosure is not limited to the four RC circuits and one, two, three, five, six or more parallel RC circuits could be provided instead. It is preferred that each RC circuit has a different time constant. In an embodiment, the capacitances and resistances may be chosen such that the RC circuits have time constants of approximately 2 s, 8 s, 15 s and 70 s respectively. It is noted that the time constants are influenced by the value of the resistor R2, which may have a resistance of between 10 kW and 100 kW, for example.

Figure 6:
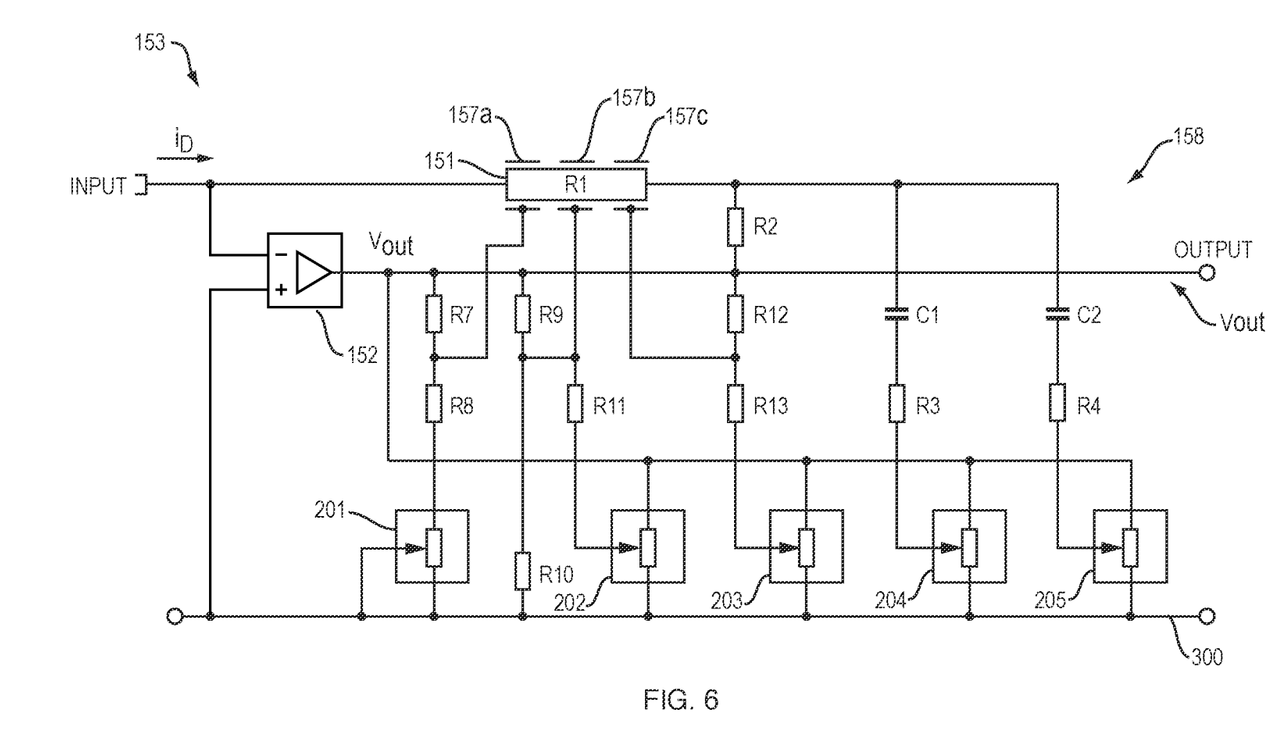
FIG. 6 schematically shows a second embodiment of a conversion amplifier unit of the disclosure.

FIG. 6 schematically shows a second embodiment of a conversion unit according to the present disclosure. The conversion unit 153 of FIG. 6 is similar to the one in FIG. 5, but the compensation element 157 consists of three parts 157a, 157c and 157c, instead of a single part, as in FIG. 5. For that reason, circuitry is provided for supplying different compensating voltages to the three parts 157a, 157b and 157c in order to provide an even better compensation. A first voltage divider comprises a series arrangement of resistors R7 and R8 and the first variable resistor 201 and serves to provide a voltage to the first compensating element part 157a. A second voltage divider comprises a series arrangement of R9 and R10, which is coupled with a series arrangement of R11 and the second variable resistor 202 and serves to supply a voltage to the second compensating element part 157b. A third voltage divider comprises a series arrangement of the resistors R12 and R13 and the variable resistor 203. The principle of such a circuit is described in the above-mentioned patent U.S. Pat. No. 9,431,976.

In the embodiment of FIG. 6, only two RC circuits are provided: a first RC circuit comprising C1 and R3 coupled to the variable resistor 204, and a second RC circuit comprising C2 and R4 coupled to the variable resistor 205. It will be understood that less than two RC circuits could be provided, such as only one RC circuit, or possibly no RC circuit at all. Conversely, more than two RC circuits could be provided, for example three or four.

Figure 7:
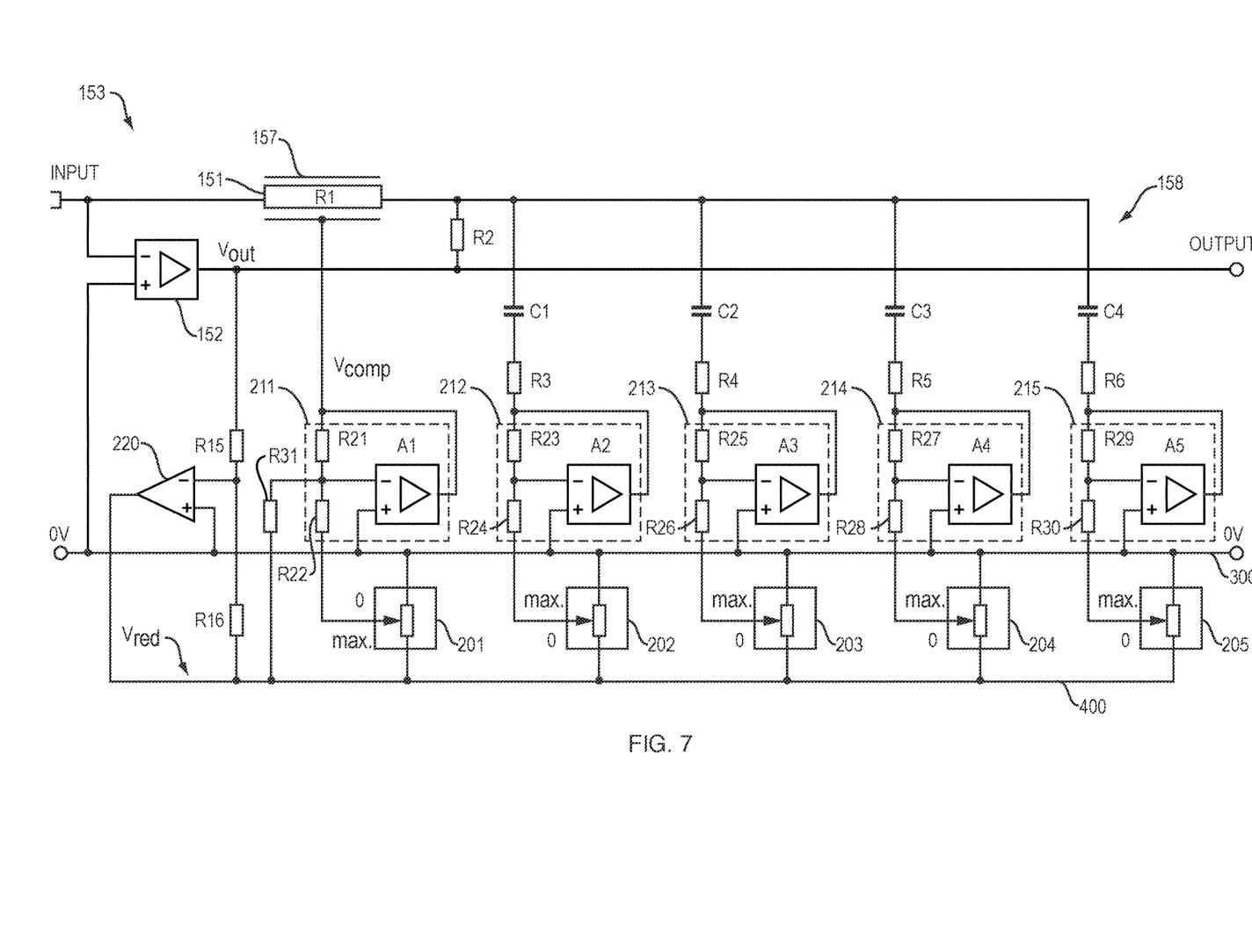
FIG. 7 schematically shows a third embodiment of a conversion amplifier unit of the disclosure.

FIG. 7 schematically shows a third embodiment of a conversion unit according to the present disclosure. An input terminal of the conversion unit is shown to be connected to the inverting input of conversion amplifier 152, while the non-inverting input is connected to ground (in the example shown the common rail 300), optionally via a compensating resistor network (not shown).

The embodiment of FIG. 7 is similar to the embodiments of FIGS. 5 & 6. Accordingly, the output of the conversion amplifier 152 is connected with the output terminal of the conversion unit 153 and, via an additional resistor R2 and a conversion resistor R1, with its inverting input to provide feedback, as in FIG. 5. In the embodiment of FIG. 7, the conversion resistor 151 is provided with a single part compensation element 157, which may be a conductive tube partially enclosing but being electrically isolated from the conversion resistor 151. The conversion resistor R1 (151) may have a very high resistance relative to the additional resistor R2.

As in FIGS. 5 & 6, the compensation circuit 158 is arranged to supply a compensation voltage to the compensation element 157 and to provide time constants by using RC circuits. In the embodiment shown, four compensatory RC circuits are directly connected to a terminal of the conversion resistor 151 and each consist of a series arrangement of a capacitor (e.g. C1) and a resistor (e.g. R3), connected to a respective variable resistor 200.

However, the embodiment of FIG. 7 is designed for a conversion resistor 151 having a value of approximately 1 TW. In such an embodiment, the voltages at the output of the conversion unit 153 may reach values of 50 V or even 100V. This would make it impossible to use digital potentiometers for the variable resistors 201-205, as digital potentiometers capable of handling such voltages are not available. Accordingly, a further aspect of the invention reduces the voltages applied to the variable resistors by using a voltage division. The voltages applied to the variable resistors may be divided by a factor of 10, for example, although other factors may also be used, for example 5, 15 or 20, as the case may be. The factors mentioned here are absolute values, as division factors may be negative, for example −10, resulting in a sign change of the voltages. It will be understood that the voltages applied to the variable resistors may be considered as being multiplied by a factor smaller than 1, such as a (multiplication) factor of 0.1, for example.

In the embodiment of FIG. 7, the (inverting) voltage dividing stage is constituted by a voltage division amplifier 220 and a voltage divider comprising the resistors R15 and R16, which are connected between the output of the amplifier 152 and an additional rail 400, to which the output of the voltage division amplifier 220 is also connected. The connection of the resistors R15 and R16 is connected with the inverting input of the voltage division amplifier 220, while the non-inverting input of the voltage division amplifier 220 is connected to the common rail 300, which in turn may be connected to ground. The ratio of the resistors R15 and R16 determines the dividing ratio, the sign of which is inverted by the voltage division amplifier 220. The variable resistors 201-205 are connected between the common rail 300 and the additional rail 400 and therefore receive the reduced voltage $V_{red}$ from the voltage division amplifier 220. This divided voltage is neutralized by voltage multiplication amplifier units 211-215 which are coupled to the respective variable resistors 201-205. Thus, an amplification by the inverse of the voltage division can result in the original compensation voltage $V_{comp}$ being supplied to, for example, the compensation element 157. Alternatively, the voltage multiplication amplifier units 211-215 can provide a suitable voltage for further processing which may differ from the original, undivided voltage. In the embodiment shown, each voltage multiplication amplifier unit (e.g. 21) comprises an amplifier (e.g. A1) and a resistor network (e.g. R21, R22). The amplifier (e.g. A1) may be constituted by an operational amplifier and may have an inverting and a non-inverting input, the inverting input being connected to the resistor network (of e.g. R21 and R22) and the non-inverting input being connected to the common rail 300.

The non-inverting input of the amplifier A1 of the first voltage multiplication amplifier unit 211 is connected to the additional rail 400 via a resistor R31 to feed the reduced (output) voltage $V_{red}$ to the first voltage multiplication amplifier unit 211. It is noted that the first voltage multiplication amplifier unit 211 is connected to the compensation element 157, whereas the other voltage multiplication amplifier units 212-215 in the embodiment of FIG. 7 are not connected to the compensation element 157 but to the RC circuits. Thus, all variable resistors are used at the reduced voltage $V_{red}$ instead of at the much higher output voltage $V_{out}$.

The variable resistors are preferably, but not necessarily digitally controlled, as manually controlled variable resistors may also be used. By using the variable resistors 202-205, the RC networks can be precisely tuned to provide the desired compensation effects.

Figure 8:
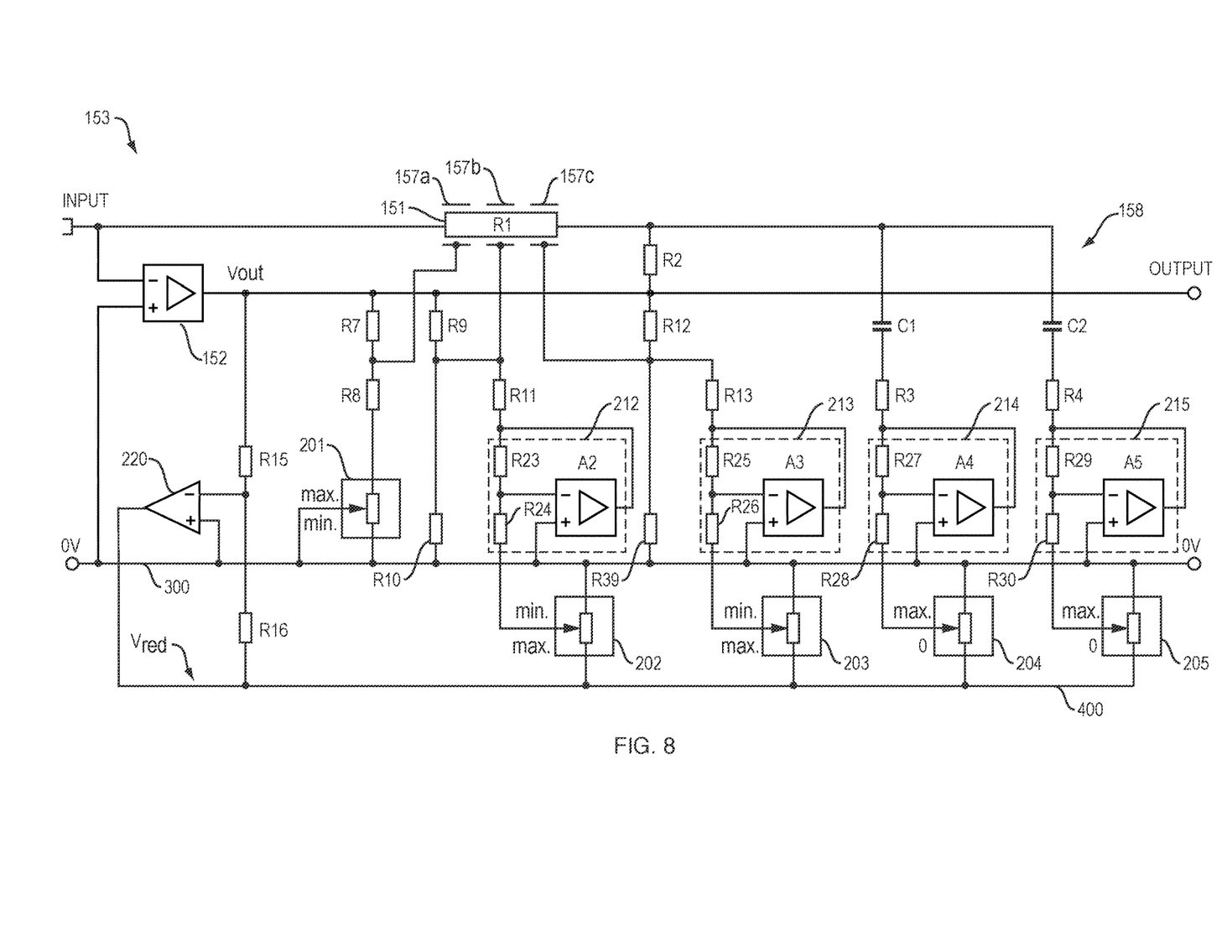
FIG. 8 schematically shows a fourth embodiment of a conversion amplifier unit of the disclosure.

FIG. 8 schematically shows a fourth embodiment of the conversion circuit of the disclosure. The embodiment of FIG. 8 is similar to the embodiment of FIG. 7, but here the conversion resistor 151 is provided with three compensation element parts 157 instead of a single compensation element. Also, only two instead of four RC networks are provided. The principle of operation of this embodiment is similar to the embodiments of FIGS. 6 and 7.

The three compensation elements 157 are provided with different voltages using resistor networks (voltage dividers) which comprise variable resistors, preferably digital variable resistors. In the embodiment shown in FIG. 8, the first part 157a of compensation element 157 receives a voltage from a resistor network which is connected between the output voltage and ground, and which does not use the reduced voltage $V_{red}$ present at the additional rail 400. This resistor network therefore does not comprise a voltage multiplication amplifier (211 in FIG. 7). In this embodiment, the voltages applied to the first variable resistor 201 are due to the values of R7 and R8 small enough to omit the voltage division and multiplication.

The second and the third compensation elements 157 receive a voltage from a resistor network including the variable resistor 202 and the voltage multiplication amplifier unit 212, and the variable resistor 203 and the voltage multiplication amplifier unit 213 respectively. In this embodiment, the voltage multiplication amplifier units 212 and 213 may not only amplify the voltages of the variable resistors but also shift these voltages to the desired level.

In this embodiment, the voltage multiplication amplifiers 214 and 215, together with their respective variable resistors 204 and 205 respectively, are connected with RC networks, similar to the embodiments of FIGS. 6 and 7.

As mentioned above, the voltage multiplication amplifiers 212-215 provide an amplification which reverses or substantially neutralizes the voltage division caused by voltage division amplifier 220 and the resistors R15 and R16. Thus, the amplification is approximately the inverse value of the fraction by which the voltages have been divided. If the voltages were divided resulting in a fraction of −0.2, for example, the correction amplifiers may have an amplification factor of approximately −5, for example in a range between −4 and −6.

Figure 9:
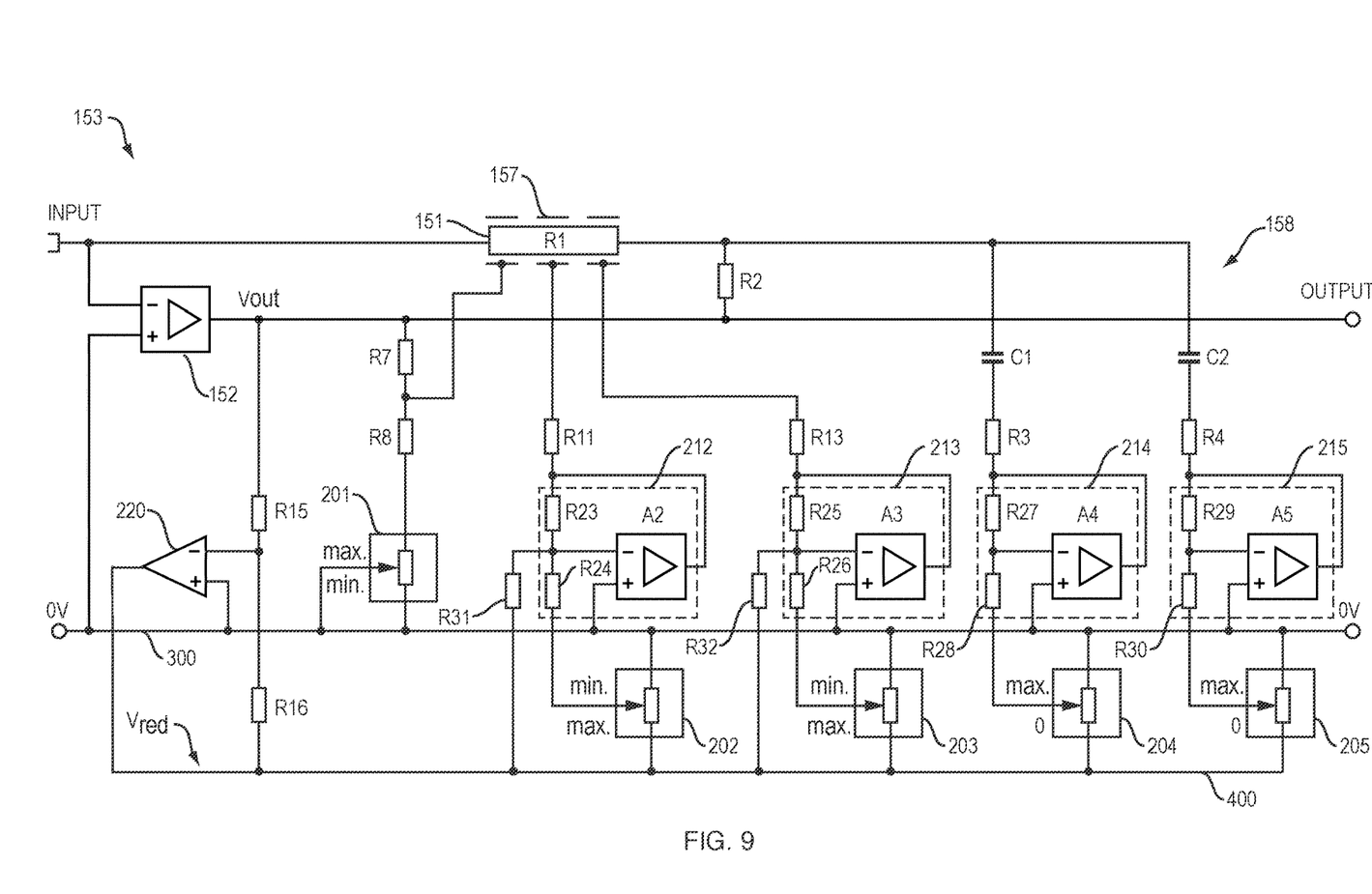
FIG. 9 schematically shows a fifth embodiment of a conversion amplifier unit of the disclosure.

FIG. 9 schematically shows a fifth embodiment of the conversion circuit of the disclosure. The embodiment of FIG. 9 is similar to the embodiment of FIG. 8, with the exception of the voltage dividers R9/R10 and R12/R39 which have been replaced with resistors R31 and R32 respectively. Accordingly, the non-inverting input of the amplifier A1 of the first correction amplifier unit 211 is connected to the additional rail 400 via the resistor R31. Similarly, the non-inverting input of the amplifier A2 of the second correction amplifier unit 212 is connected to the additional rail 400 via an optional resistor R32. As the resistors R31 and R32 are connected to the additional rail 400, they receive the reduced voltage $V_{red}$ and consequently, only a very small current will flow through R31 and R32, causing very little heat. In contrast, the resistor pairs R9/R10 and R12/R39 are connected to the full output voltage $V_{out}$, which may be for example 10 times as high as $V_{red}$. As a result, the current flowing through the resistor pairs R9/R10 and R12/R39 will be higher, generating more heat. In order to minimize the heat production in the conversion circuit, the embodiment of FIG. 9 can be used.

Although the embodiments have been described with reference to mass spectrometers, the disclosure may also be applied in other fields of spectrometry or spectroscopy, for instance optical spectrometry.

It will therefore be understood by those skilled in the art that the disclosure is not limited to the embodiments shown and that many additions and modifications can be made without departing from the scope of the disclosure as defined in the appending claims.

What is claimed is:

1. A conversion circuit for converting an ion detection current produced by an ion detector into an ion detection voltage, the conversion circuit comprising:
a conversion amplifier coupled with a conversion resistor assembly for converting an ion detection current into an ion detection voltage, the conversion resistor assembly comprising at least one resistor having a high resistance and at least one capacitive compensation element;
a compensation voltage circuit for deriving at least one compensation voltage from the ion detection voltage and feeding the at least one compensation voltage to the at least one capacitive compensation element, the compensation voltage circuit comprising at least one variable resistor for adjusting the at least one compensation voltage;
a voltage reduction circuit for deriving a reduced voltage from the ion detection voltage, the voltage reduction circuit being arranged for supplying the reduced voltage to the at least one variable resistor, wherein the compensation voltage circuit comprising at least one neutralizing amplifier unit coupled between the at least one capacitive compensation element and the at least one variable resistor for at least partially neutralizing the voltage reduction of the voltage reduction circuit.

2. The conversion circuit according to claim 1, wherein the voltage reduction circuit comprises a voltage divider and an amplifier, the amplifier preferably being an operational amplifier and the voltage divider preferably being connected to an inverting input of the operational amplifier.

3. The conversion circuit according to claim 1, wherein the voltage reduction circuit is arranged for effecting a voltage reduction of at least 25%.

4. The conversion circuit according to claim 1, wherein the at least one neutralizing amplifier unit comprises an amplifier and a voltage divider.

5. The conversion circuit according to claim 4, wherein the at least one neutralizing amplifier unit is arranged in series with a variable voltage terminal of the at least one variable resistor.

6. The conversion circuit according to any of the preceding claims, comprising at least two neutralizing amplifier units and at least two variable resistors.

7. The conversion circuit according to claim 6, further comprising at least one RC circuit coupled between an output terminal of the conversion resistor and a series arrangement of a further neutralizing amplifier unit and a further variable resistor.

8. The conversion circuit according to claim 7, further comprising an additional resistor coupled between the conversion resistor and an output of the conversion amplifier, the additional resistor having a resistance which is small relative to the resistance of the conversion resistor.

9. The conversion circuit according to claim 8, wherein the resistance of the additional resistor is less than 1% of the resistance of the conversion resistor.

10. The conversion circuit according to claim 7, comprising at least two parallel RC circuits having different time constants.

11. The conversion circuit according to claim 10, wherein the time constants are distributed approximately logarithmically.

12. The conversion circuit according to claim 1, wherein at least one variable resistor is a digital variable resistor.

13. A conversion circuit for converting an ion detection current produced by an ion detector into an ion detection voltage, the conversion circuit comprising:
a conversion amplifier coupled with a conversion resistor assembly for converting an ion detection current into an ion detection voltage, the conversion resistor assembly comprising at least one resistor having a high resistance and at least one capacitive compensation element;
a compensation voltage circuit for deriving at least one compensation voltage from the ion detection voltage and feeding the at least one compensation voltage to the at least one capacitive compensation element, the compensation voltage circuit comprising at least one variable resistor for adjusting the at least one compensation voltage; and
at least one RC circuit coupled to the conversion resistor.

14. The conversion circuit according to claim 13, wherein the at least one RC circuit is coupled between the conversion resistor and a further variable resistor.

15. The conversion circuit according to claim 14, further comprising an additional resistor coupled between the conversion resistor and an output of the conversion amplifier, the additional resistor having a resistance which is small relative to the resistance of the conversion resistor.

16. The conversion circuit according to claim 15, wherein the resistance of the additional resistor is less than 1% of the resistance of the conversion resistor.

17. The conversion circuit according to claim 13, comprising at least two parallel RC circuits having different time constants.

18. The conversion circuit according to claim 17, wherein the time constants are distributed approximately logarithmically.

19. The conversion circuit according to claim 13, wherein the conversion resistor assembly comprises one capacitive compensation element.

20. The conversion circuit according to claim 13, wherein the conversion resistor assembly comprises three capacitive compensation elements.

21. The conversion circuit according to claim 13, wherein the conversion resistor has a resistance of at least 100 gigaohms.

22. A mass spectrometer comprising a conversion circuit, the conversion circuit having:

a conversion amplifier coupled with a conversion resistor assembly for converting an ion detection current into an ion detection voltage, the conversion resistor assembly comprising at least one resistor having a high resistance and at least one capacitive compensation element;

a compensation voltage circuit for deriving at least one compensation voltage from the ion detection voltage and feeding the at least one compensation voltage to the at least one capacitive compensation element, the compensation voltage circuit comprising at least one variable resistor for adjusting the at least one compensation voltage; and at least one RC circuit coupled to the conversion resistor.

23. The mass spectrometer according to claim 22, further comprising at least one of:
a magnetic sector unit
an electric sector unit,
an array of Faraday cups,
an ion source, or
a mass filter.

* * * * *